United States Patent
Kano et al.

(10) Patent No.: US 10,797,315 B2
(45) Date of Patent: Oct. 6, 2020

(54) ELECTROCHEMICAL DEVICE WITH NEGATIVE ELECTRODE ACTIVE MATERIAL HAVING AN FM3M SPACE GROUP

(71) Applicant: Panasonic Intellectual Property Management Co., Ltd., Osaka (JP)

(72) Inventors: Akira Kano, Osaka (JP); Junichi Sakamoto, Osaka (JP); Nobuhiko Hojo, Tokyo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 76 days.

(21) Appl. No.: 15/597,179

(22) Filed: May 17, 2017

(65) Prior Publication Data

US 2017/0346091 A1    Nov. 30, 2017

(30) Foreign Application Priority Data

May 27, 2016    (JP) .................................. 2016-105985

(51) Int. Cl.
  H01M 4/485    (2010.01)
  H01G 11/06    (2013.01)
  (Continued)

(52) U.S. Cl.
  CPC .......... H01M 4/485 (2013.01); C01G 23/005 (2013.01); C30B 29/32 (2013.01); H01G 11/06 (2013.01);
  (Continued)

(58) Field of Classification Search
  CPC ........... H01M 4/485; H01M 2004/027; H01M 4/0404; H01M 10/0525; H01M 4/131; H01M 4/623; H01M 4/625; H01M 4/661; H01M 4/0435; H01M 4/1391; H01G 11/68; H01G 11/46; H01G 11/50; H01G 11/06; C30B 29/32; C01G 23/005; C01P 2002/72; C01P 2002/30; C01P 2006/40
  See application file for complete search history.

(56) References Cited

U.S. PATENT DOCUMENTS

2011/0262809 A1    10/2011    Kumagai et al.
2013/0260251 A1*   10/2013    Shiroki .................. H01M 4/485
                                                       429/231.1

FOREIGN PATENT DOCUMENTS

| JP | 2004-103566 | 4/2004 |
| WO | 2010/052950 | 5/2010 |
| WO | WO-2014194996 A1 * | 12/2014 ........... C01G 23/005 |

OTHER PUBLICATIONS

Zheng et al., Li- and Mn-Rich Cathode Materials: Challenges to Commercialization, Advanced Energy Materials 2017, 1601284 (Year: 2016).*

* cited by examiner

*Primary Examiner* — Maria Laios
*Assistant Examiner* — Kwang Han
(74) *Attorney, Agent, or Firm* — McDermott Will & Emery LLP

(57) ABSTRACT

An electrochemical device includes a negative electrode containing a negative electrode active material, a positive electrode, and an electrolyte. The negative electrode active material has a crystal structure with an Fm3m space group and contains a compound represented by composition formula (1) below, $$Li_x Ti_y O_z \qquad \text{Formula (1),}$$

where $0.4 \leq x/y < 2$ and $x/2 + 3y/2 \leq z \leq x/2 + 2y$.

3 Claims, 2 Drawing Sheets

(51) Int. Cl.
*C01G 23/00* (2006.01)
*C30B 29/32* (2006.01)
*H01G 11/46* (2013.01)
*H01G 11/50* (2013.01)
*H01M 4/131* (2010.01)
*H01M 10/0525* (2010.01)
*H01M 4/02* (2006.01)
*H01G 11/68* (2013.01)
*H01M 4/62* (2006.01)
*H01M 4/66* (2006.01)
*H01M 4/04* (2006.01)
*H01M 4/1391* (2010.01)

(52) U.S. Cl.
CPC ............ *H01G 11/46* (2013.01); *H01G 11/50* (2013.01); *H01G 11/68* (2013.01); *H01M 4/131* (2013.01); *H01M 4/623* (2013.01); *H01M 4/625* (2013.01); *H01M 4/661* (2013.01); *H01M 10/0525* (2013.01); *C01P 2002/30* (2013.01); *C01P 2002/72* (2013.01); *C01P 2006/40* (2013.01); *H01M 4/0404* (2013.01); *H01M 4/0435* (2013.01); *H01M 4/1391* (2013.01); *H01M 2004/027* (2013.01)

ELECTROCHEMICAL DEVICE WITH NEGATIVE ELECTRODE ACTIVE MATERIAL HAVING AN FM3M SPACE GROUP

BACKGROUND

1. Technical Field

The present disclosure relates to a negative electrode active material for electrochemical devices and to an electrochemical device.

2. Description of the Related Art

A non-stoichiometric titanium compound having a spinel (Fd3m space group) structure and represented by chemical formula $Li_{4+x}Ti_{5-x}O_{12}$ (where $0<x<0.30$) is disclosed in International Publication No. WO 2010/052950.

SUMMARY

In the related art, there is a need to obtain a negative electrode active material and an electrochemical device that have a high discharge capacity density.

In one general aspect, the techniques disclosed here feature an electrochemical device including a negative electrode containing a negative electrode active material, a positive electrode, and an electrolyte. The negative electrode active material has a crystal structure with an Fm3m space group and contains a compound represented by composition formula (1) below, where $0.4 \leq x/y < 2$ and $x/2+3y/2 \leq z \leq x/2+2y$.

The present disclosure provides a negative electrode active material and an electrochemical device that have a high discharge capacity density.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
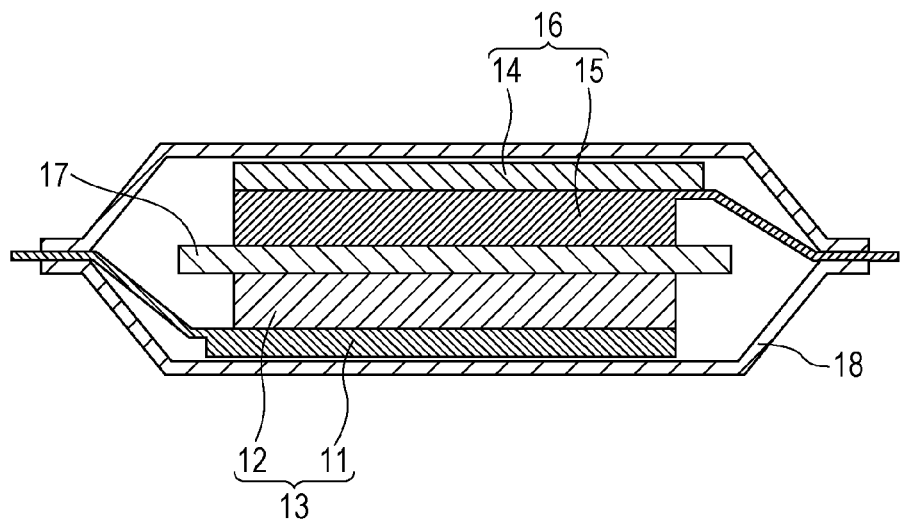
FIG. 1 is a schematic sectional view of the structure of an example battery in a second embodiment.

The embodiments of the present disclosure will be described below.

First Embodiment

A negative electrode active material in a first embodiment contains a compound having a crystal structure with an Fm3m space group.

The compound is represented by composition formula (1) below:

$$Li_xTi_yO_z \qquad \text{Formula (1)}$$

where $0.4 \leq x/y < 2$ and $x/2+3y/2 \leq z \leq x/2+2y$.

The configuration described above provides a lithium titanium oxide-based negative electrode active material having a high discharge capacity density and an electrochemical device (e.g., battery or capacitor) including the lithium titanium oxide-based negative electrode active material. In other words, the configuration described above provides an electrochemical device (e.g., battery or capacitor) having a high discharge capacity density.

The negative electrode active material in the first embodiment is characterized by its crystal structure and its composition ratio of lithium, titanium, and oxygen. The inventor of the present invention has studied the structure of lithium titanium oxide, the composition ratio of lithium, titanium, and oxygen contained, and the reactivity between lithium titanium oxide and lithium ions. As a result, it has been found that a discharge capacity density larger than that in the related art is achieved by using a negative electrode active material having a crystal structure with an Fm3m space group and a particular composition ratio of lithium, titanium, and oxygen.

When the crystal structure of the negative electrode active material in the first embodiment is a rock-salt structure with an Fm3m space group, the negative electrode active material has a discharge capacity larger than that for, for example, a spinel structure (Fd3m space group). A reason for this is, for example, as described below. When the crystal structure is not a rock-salt structure with an Fm3m space group, lithium, titanium, and oxygen are regularly arranged in the structure. Consequently, the amount of Li ions to be intercalated is limited during charging and discharging. For example, in lithium titanium oxide having a spinel structure (Fd3m space group), lithium occupies the 8a sites, lithium and titanium occupy the 16d sites, and oxygen occupies the 32e sites. In this case, movable Li ions in the structure during charging and discharging are limited to Li ions at the 8a sites. In other words, Li ions at the 16d sites are fixed in the structure and cannot move. Therefore, the amount of Li ions to be intercalated is small for the spinel structure. When the negative electrode active material has a crystal structure with an Fm3m space group, lithium, titanium, and oxygen are randomly arranged in the structure. Therefore, the sites between which Li ions move in the structure during charging and discharging are not limited. As a result, more Li ions can be intercalated (and deintercalated) for Fm3m space group.

In the negative electrode active material in the first embodiment, the discharge capacity of the negative electrode active material can be increased by satisfying $0.4 \leq x/y$. If $0.4 > x/y$, for example, it is difficult to maintain the Fm3m space group in the crystal structure of the negative electrode active material, which reduces discharge capacity.

In the negative electrode active material in the first embodiment, the discharge capacity of the negative electrode active material can be increased by satisfying $x/y < 2$. If $x/y \geq 2$, for example, the ratio of Li/Ti is large, and the amount of Li ions that can be intercalated into the structure of the negative electrode active material is small. This reduces discharge capacity.

In the negative electrode active material in the first embodiment, the discharge capacity of the negative electrode active material can be increased by satisfying $x/2+3y/2 \leq z$. If $x/2+3y/2 > z$, for example, it is difficult to maintain the Fm3m space group in the crystal structure of the negative electrode active material, which reduces discharge capacity.

In the negative electrode active material in the first embodiment, the discharge capacity of the negative electrode active material can be increased by satisfying $z \leq x/2+2y$. If $z > x/2+2y$, for example, the ratio of O to Li is large.

This causes positively charged Li to be fixed to negatively charged O in the structure. The discharge capacity is thus small if $z>x/2+2y$.

The compound represented by composition formula (1) can be identified by determining the space group of the crystal structure by powder X-ray analysis.

The composition of the identified compound represented by composition formula (1) can be determined by, for example, ICP emission spectrometric analysis and inert gas fusion-infrared absorption analysis.

The negative electrode active material in the first embodiment may satisfy $0.4 \leq x/y \leq 1.6$.

The above composition provides an electrochemical device (e.g., battery or capacitor) having a high discharge capacity density.

The negative electrode active material in the first embodiment may satisfy $0.4 \leq x/y \leq 0.8$.

The above composition provides an electrochemical device (e.g., battery or capacitor) having a high discharge capacity density.

The negative electrode active material in the first embodiment may satisfy $z=x/2+2y$.

The above composition provides an electrochemical device (e.g., battery or capacitor) having a high discharge capacity density.

Method for Producing Negative Electrode Active Material

The negative electrode active material in the first embodiment can be produced by, for example, the method described below.

A Li-containing material and a Ti-containing material are prepared. Examples of the Li-containing material include oxides, such as $Li_2O$ and $Li_2O_2$; salts, such as $Li_2CO_3$ and LiOH; and lithium titanium oxides, such as $Li_4Ti_5O_{12}$, having a spinel (Fd3m space group) structure. Examples of the Ti-containing material include oxides, such as $TiO_2$ and TiO; and lithium titanium oxides, such as $Li_4Ti_5O_{12}$, having a spinel (Fd3m space group) structure.

These materials are weighed out so as to obtain the molar ratio indicated in composition formula (1).

With the above-mentioned operation, "x, y, and z" in composition formula (1) can be varied in the ranges indicated in composition formula (1).

The weighed materials are, for example, mixed by a dry method or a wet method and caused to mechanochemically react with each other for 10 hours or longer, which provides a negative electrode active material having a crystal structure with an Fm3m space group and represented by composition formula (1). For example, a mixing device, such as a ball mill, can be used.

The negative electrode active material substantially represented by composition formula (1) can be obtained by controlling materials to be used and the conditions for mixing a material mixture.

As described above, a method for producing the negative electrode active material in an aspect of the first embodiment includes a step (a) of preparing materials and a step (b) of obtaining a negative electrode active material by causing the materials to mechanochemically react with each other.

In this case, the step (a) may include a step of producing lithium titanium oxide, which is a material, by a publicly known method.

The step (b) may include a step of causing the materials to mechanochemically react with each other using a ball mill.

As described above, the compound represented by composition formula (1) can be synthesized by causing precursors (e.g., $Li_2O$, $TiO_2$) to mechanochemically react with each other using a planetary ball mill.

In this case, the negative electrode active material is allowed to contain desired amounts of lithium, titanium, and oxygen atoms by controlling the mixing ratio of the precursors.

If the above precursors are caused to react with each other by a solid phase method, the precursors are decomposed into more stable compounds.

In other words, for example, a method for causing the precursors to react with each other by a solid phase method fails to provide a negative electrode active material having a crystal structure with an Fm3m space group and represented by composition formula (1).

Second Embodiment

A second embodiment will be described below. The descriptions overlapping those in the first embodiment described above are appropriately omitted.

A battery and a capacitor will be described below as example electrochemical devices of the present disclosure.

A battery according to the second embodiment includes a negative electrode, a positive electrode, and an electrolyte.

The negative electrode contains the negative electrode active material according to the first embodiment described above.

The above structure provides a battery having a high discharge capacity density.

In the battery according to the second embodiment, the negative electrode may contain a negative electrode active material as a main component.

More specifically, the negative electrode may contain, for example, 50% by weight or more of the negative electrode active material according to the first embodiment based on the total weight of a negative electrode material (e.g., a negative electrode mixture layer).

The above configuration provides a battery having a high discharge capacity density.

The negative electrode may contain, for example, 70% by weight or more of the negative electrode active material according to the first embodiment based on the total weight of a negative electrode material (e.g., a negative electrode mixture layer).

The above configuration provides a battery having a high discharge capacity density.

The negative electrode active material layer in the battery according to the second embodiment may further contain unavoidable impurities, starting materials used to synthesize the negative electrode active material, by-products, decomposition products, and the like while containing the negative electrode active material as a main component.

The negative electrode active material layer in the battery according to the second embodiment may contain, for example, 100% by weight of the negative electrode active material according to the first embodiment based on the total weight of the negative electrode active material layer except for unavoidable impurities.

The above configuration provides a battery having a high discharge capacity density.

FIG. 1 is a schematic sectional view of the structure of a battery 10, which is an example battery in the second embodiment.

As illustrated in FIG. 1, the battery 10 includes a negative electrode 13, a positive electrode 16, a separator 17, and a case 18.

The negative electrode 13 includes a negative electrode current collector 11 and a negative electrode mixture layer 12 (or a negative electrode active material layer) formed on and in contact with the negative electrode current collector 11.

The positive electrode 16 includes a positive electrode current collector 14 and a positive electrode mixture layer 15 (or a positive electrode active material layer) formed on and in contact with the positive electrode current collector 14.

The negative electrode 13 and the positive electrode 16 are disposed to oppose each other across the separator 17.

These components are placed in the case 18 to form the battery 10.

The negative electrode mixture layer 12 contains the negative electrode active material according to the first embodiment described above.

The negative electrode mixture layer 12 may contain, for example, a conductive assistant, an ion conductor, a binder, and a negative electrode active material that can intercalate and deintercalate lithium ions and that is different from the negative electrode active material according to the first embodiment, as desired.

The conductive assistant and the ion conductor are used in order to reduce the resistance of the electrode. Examples of the conductive assistant include carbon materials (carbon conductive assistants), such as carbon black, graphite, and acetylene black; and conductive polymer compounds, such as polyaniline, polypyrrole, and polythiophene. Examples of the ion conductor include gel electrolytes, such as polymethyl methacrylate; organic solid electrolytes, such as polyethylene oxide; and inorganic solid electrolytes, such as $Li_7La_3Zr_2O_{12}$.

The binder is used in order to improve the bonding strength between materials contained in the electrode. Specific examples of the binder include polyvinylidene fluoride, vinylidene fluoride-hexafluoropropylene copolymer, vinylidene fluoride-tetrafluoroethylene copolymer, polytetrafluoroethylene, carboxymethyl cellulose, polyacrylic acid, styrene-butadiene copolymer rubber, polypropylene, polyethylene, and polyimide.

As the negative electrode current collector 11, a porous or non-porous sheet or film made of a metal material, such as stainless steel, nickel, copper, or an alloy thereof, can be used. As the sheet or film, for example, a metal foil or a mesh is used. A carbon material, such as carbon, may be applied to the surface of the negative electrode current collector 11 as a conductive assistant material in order to reduce the resistance, impart a catalytic effect, and increase the bonding strength between the negative electrode mixture layer 12 and the negative electrode current collector 11 through chemical or physical bonding between the negative electrode mixture layer 12 and the negative electrode current collector 11.

The positive electrode mixture layer 15 contains a positive electrode active material that can intercalate and deintercalate lithium ions.

The positive electrode mixture layer 15 may contain, for example, the same conductive assistant, the same ion conductor, and the same binder as those in the negative electrode mixture layer 12 as desired.

As the positive electrode active material, a material that intercalates and deintercalates lithium ions may be used. Examples of the positive electrode active material include lithium metal-containing transition metal oxides, transition metal fluorides, polyanion materials, fluorinated polyanion materials, and transition metal sulfides. Among these materials, lithium metal-containing transition metal oxides are preferably used because of low production costs and high average discharge voltage.

As the positive electrode current collector 14, a porous or non-porous sheet or film made of a metal material, such as aluminum, stainless steel, titanium, or an alloy thereof, can be used. Aluminum and an alloy thereof are preferred because they are inexpensive and easily formed into a thin film. As the sheet or film, for example, a metal foil or a mesh may be used. A carbon material, such as carbon, may be applied to the surface of the positive electrode current collector 14 in order to reduce the resistance, impart a catalytic effect, and increase the bonding strength between the positive electrode mixture layer 15 and the positive electrode current collector 14 through chemical or physical bonding between the positive electrode mixture layer 15 and the positive electrode current collector 14.

The electrolyte used in the second embodiment may be a non-aqueous electrolyte. As the electrolyte used in this embodiment, for example, an electrolyte solution containing a lithium salt and a nonaqueous solvent, a gel electrolyte, or a solid electrolyte may be used.

Examples of the lithium salt to be used include lithium hexafluorophosphate ($LiPF_6$), lithium tetrafluoroborate ($LiBF_4$), lithium perchlorate ($LiClO_4$), lithium bis(trifluoromethylsulfonyl)imide ($LiN(SO_2CF_3)_2$), lithium bis(perfluoroethylsulfonyl)imide ($LiN(SO_2C_2F_5)_2$), lithium bis(fluoromethylsulfonyl)imide ($LiN(SO_2F)_2$), $LiAsF_6$, $LiCF_3SO_3$, and lithium difluoro(oxalato)borate. Among these lithium salts, $LiPF_6$ is preferably used from the viewpoint of the safety and thermal stability of the battery and the ion conductivity in the battery. The electrolyte salts may be used alone or in combination of two or more.

Examples of the nonaqueous solvent to be used include cyclic carbonates, chain carbonates, esters, cyclic ethers, chain ethers, nitriles, and amides that are usually used as nonaqueous solvents for batteries. These solvents may be used alone or in combination of two or more.

Examples of cyclic carbonates include ethylene carbonate, propylene carbonate, and butylene carbonate. The hydrogen groups of the cyclic carbonates may be partially fluorinated or entirely fluorinated. Examples include trifluoropropylene carbonate and fluoroethyl carbonate.

Examples of chain carbonates include dimethyl carbonate, ethyl methyl carbonate, diethyl carbonate, methyl propyl carbonate, ethyl propyl carbonate, and methyl isopropyl carbonate. The hydrogen groups of the chain carbonates may be partially fluorinated or entirely fluorinated.

Examples of esters include methyl acetate, ethyl acetate, propyl acetate, methyl propionate, ethyl propionate, and γ-butyrolactone.

Examples of cyclic ethers include 1,3-dioxolane, 4-methyl-1,3-dioxolane, tetrahydrofuran, 2-methyltetrahydrofuran, propylene oxide, 1,2-butyleneoxide, 1,4-dioxane, 1,3,5-trioxane, furan, 2-methylfuran, 1,8-cineole, and crown ether.

Examples of chain ethers include 1,2-dimethoxyethane, diethyl ether, dipropyl ether, diisopropyl ether, dibutyl ether, dihexyl ether, ethyl vinyl ether, butyl vinyl ether, methyl phenyl ether, ethyl phenyl ether, butyl phenyl ether, pentyl phenyl ether, methoxy toluene, benzyl ethyl ether, diphenyl ether, dibenzyl ether, o-dimethoxybenzene, 1,2-diethoxyethane, 1,2-dibutoxyethane, diethylene glycol dimethyl ether, diethylene glycol diethyl ether, diethylene glycol dibutyl ether, 1,1-dimethoxymethane, 1,1-diethoxyethane, triethylene glycol dimethyl ether, and tetraethylene glycol dimethyl.

Examples of nitriles include acetonitrile.

Examples of amides include dimethylformamide.

The battery according to the second embodiment may have various shapes, such as a coin shape, a cylindrical shape, a prismatic shape, a sheet shape, a button shape, a flat shape, and a stacked shape.

The electrochemical device of the present disclosure may be a capacitor (e.g., lithium ion capacitor). In other words, the negative electrode active material described in the first embodiment may be used as a negative electrode material for lithium ion capacitors. This provides a lithium ion capacitor including a negative electrode containing the negative electrode active material described in the first embodiment. The above configuration enables the lithium ion capacitor to have large capacity.

The lithium ion capacitor of the present disclosure may include a positive electrode containing a carbon material (e.g., activated carbon). In this case, for example, anion species (e.g., $PF_6^-$) in the electrolyte solution may be adsorbed to or desorbed from the carbon material in the positive electrode.

EXAMPLES

Examples described below are for illustrative purposes only, and the present disclosure is not limited only to Examples described below.

Example 1

Production of Negative Electrode Active Material

A negative electrode active material was produced in two steps: a step of preparing materials, and a step of causing the materials to mechanochemically react with each other.

First, the step of preparing materials will be described.

$Li_2O$ and $TiO_2$ were weighed out in a molar ratio $Li_2O/TiO_2$ of 4.0/5.0.

Next, the step of causing the materials to mechanochemically react with each other will be described.

The obtained materials were placed in a 45-cc zirconia jar together with an appropriate amount of ϕ3 mm zirconia balls, and the jar was sealed in a glovebox with an Ar atmosphere having a dew point of −60 degrees Celsius or lower and an oxygen value of 1 ppm or less.

The zirconia jar was taken out of the glovebox and placed in a planetary ball mill to process the materials at 600 rpm for 30 hours.

The obtained negative electrode active material was subjected to powder X-ray diffraction analysis.

Figure 2:
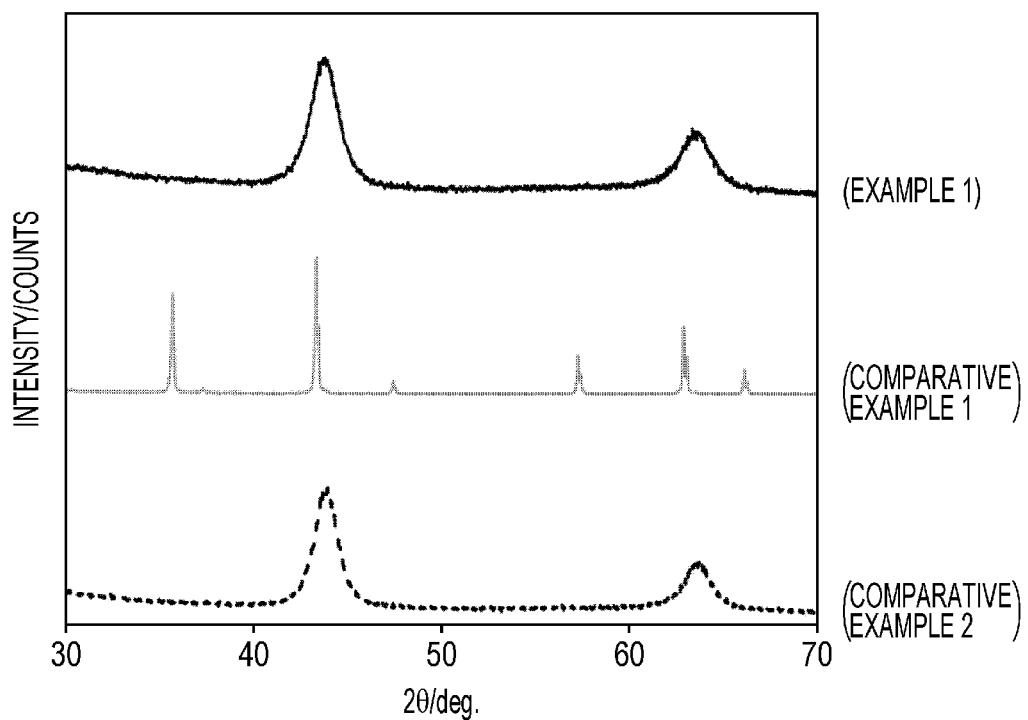
FIG. 2 is a graph illustrating the results of powder X-ray diffraction analysis.

The results of the analysis are shown in FIG. 2.

The space group of the obtained negative electrode active material was found to be Fm3m.

The composition of the obtained negative electrode active material was determined by ICP emission spectrometric analysis and inert gas fusion-infrared absorption analysis.

As a result, the composition of the obtained negative electrode active material was found to be $Li_8Ti_5O_{14}$.

Production of Test Electrode

The obtained negative electrode active material, conductive assistant acetylene black, and binding agent polyvinylidene fluoride were weighed out in a weight ratio of 7:2:1.

These materials were dispersed in an NMP solvent to form a slurry.

The prepared slurry was applied to a Cu current collector by using a coater.

The coated electrode plate was rolled with a rolling mill and punched out in the form of a square having sides of 20 mm.

This was processed into an electrode to provide a test electrode of Example 1.

Production of Evaluation Cell

A lithium secondary battery (evaluation cell) in which lithium metal was used for a counter electrode and a reference electrode was produced by using the test electrode described above.

Preparation of an electrolyte solution and production of the evaluation cell were carried out in a glovebox with an Ar atmosphere having a dew point of −60 degrees Celsius or lower and an oxygen value of 1 ppm or less.

A 1 molar solution of lithium hexafluorophosphate ($LiPF_6$) in a solvent obtained by mixing ethylene carbonate and ethyl methyl carbonate in a volume ratio of 1:3 was used as an electrolyte solution.

Lithium metal was pressure-bonded to a square nickel mesh having sides of 20 mm. This was used as a counter electrode.

The test electrode and the counter electrode were disposed to oppose each other across a separator. The separator was a polyethylene microporous membrane impregnated with the electrolyte solution. In this state, these components were placed in a case, and the case was sealed.

The evaluation cell of Example 1 was obtained accordingly.

Charge/Discharge Test

A charge/discharge test was carried out to evaluate the charge/discharge characteristic of the evaluation cell.

The method and the results of the charge/discharge test will be described.

The charge/discharge test for the evaluation cell was carried out in a thermostatic bath at 25° C.

The charge/discharge test involved charging a test electrode containing the negative electrode active material and then discharging the test electrode after a 20-minute pause.

The initial discharge capacity (charge/discharge characteristic) was evaluated by the following method.

The test electrode was charged (Li ions were intercalated) at a constant current of 8.75 mA per unit weight of the negative electrode active material until the difference in potential between the test electrode and a reference electrode reached 0 V.

The test electrode was then discharged (Li ions were deintercalated) at a constant current of 8.75 mA per unit weight of the negative electrode active material until the difference in potential between the test electrode and the reference electrode reached 3 V. The initial discharge capacity was determined accordingly.

The initial discharge capacity of the negative electrode active material of Example 1 was found to be 197 mAh/g.

Example 2

In the step of preparing materials, $Li_2O$ and $TiO_2$ were weighed out in a molar ratio $Li_2O/TiO_2$ of 3.0/5.0.

A negative electrode active material of Example 2 was produced by the same method as that in Example 1 described above except for the molar ratio $Li_2O/TiO_2$.

The space group of the obtained negative electrode active material of Example 2 was found to be Fm3m.

The composition of the obtained negative electrode active material of Example 2 was found to be $Li_6Ti_5O_{13}$.

A test electrode and an evaluation cell were produced by the same methods as those in Example 1 described above, and the charge/discharge characteristic was evaluated.

The initial discharge capacity of the negative electrode active material of Example 2 was found to be 233 mAh/g.

Example 3

In the step of preparing materials, $Li_2O$ and $TiO_2$ were weighed out in a molar ratio $Li_2O/TiO_2$ of 2.0/5.0.

The negative electrode active material of Example 3 was produced by the same method as that in Example 1 described above except for the molar ratio $Li_2O/TiO_2$.

The space group of the obtained negative electrode active material of Example 3 was found to be Fm3m.

The composition of the obtained negative electrode active material of Example 3 was found to be $Li_4Ti_5O_{12}$.

A test electrode and an evaluation cell were produced by the same methods as those in Example 1 described above, and the charge/discharge characteristic was evaluated.

The initial discharge capacity of the negative electrode active material of Example 3 was found to be 246 mAh/g.

Example 4

In the step of preparing materials, $Li_2O$ and $TiO_2$ were weighed out in a molar ratio $Li_2O/TiO_2$ of 1.5/5.0.

The negative electrode active material of Example 4 was produced by the same method as that in Example 1 described above except for the molar ratio $Li_2O/TiO_2$.

The space group of the obtained negative electrode active material of Example 4 was found to be Fm3m.

The composition of the obtained negative electrode active material of Example 4 was found to be $Li_6Ti_{10}O_{23}$.

A test electrode and an evaluation cell were produced by the same methods as those in Example 1 described above, and the charge/discharge characteristic was evaluated.

The initial discharge capacity of the negative electrode active material of Example 4 was found to be 285 mAh/g.

Example 5

In the step of preparing materials, $Li_2O$ and $TiO_2$ were weighed out in a molar ratio $Li_2O/TiO_2$ of 1.0/5.0.

The negative electrode active material of Example 5 was produced by the same method as that in Example 1 described above except for the molar ratio $Li_2O/TiO_2$.

The space group of the obtained negative electrode active material of Example 5 was found to be Fm3m.

The composition of the obtained negative electrode active material of Example 5 was found to be $Li_2Ti_5O_{11}$.

A test electrode and an evaluation cell were produced by the same methods as those in Example 1 described above, and the charge/discharge characteristic was evaluated.

The initial discharge capacity of the negative electrode active material of Example 5 was found to be 302 mAh/g.

Example 6

In the step of preparing materials, a lithium titanium oxide ($Li_4Ti_5O_{12}$) having a spinel (Fd3m space group) structure was obtained by using a publicly known technique. Specifically, LiOH and $TiO_2$ were weighed out in a molar ratio $LiOH/TiO_2$ of 4.0/5.0 and fired at 700° C. in an air atmosphere for 12 hours. The lithium titanium oxide was produced in the step described above.

The negative electrode active material of Example 6 was produced by the same method as that in Example 1 described above except for these conditions. That is, the same step of causing the mechanochemical reaction as that in Example 1 described above was carried out by using the produced lithium titanium oxide as a material.

The space group of the obtained negative electrode active material of Example 6 was found to be Fm3m.

The composition of the obtained negative electrode active material of Example 6 was found to be $Li_4Ti_5O_{12}$.

A test electrode and an evaluation cell were produced by the same methods as those in Example 1 described above, and the charge/discharge characteristic was evaluated.

The initial discharge capacity of the negative electrode active material of Example 6 was found to be 271 mAh/g.

Comparative Example 1

A lithium titanium oxide ($Li_4Ti_5O_{12}$) having a spinel (Fd3m space group) structure produced by using a publicly known technique was used as a negative electrode active material of Comparative Example 1. Specifically, LiOH and $TiO_2$ were weighed out in a molar ratio $LiOH/TiO_2$ of 4.0/5.0 and fired at 700° C. in an air atmosphere for 12 hours. The negative electrode active material of Comparative Example 1 was produced in the step described above.

The obtained negative electrode active material of Comparative Example 1 was subjected to powder X-ray diffraction analysis.

The results of the analysis are shown in FIG. 2.

The space group of the obtained negative electrode active material of Comparative Example 1 was found to be Fd3m.

The composition of the obtained negative electrode active material of Comparative Example 1 was found to be $Li_4Ti_5O_{12}$.

A test electrode and an evaluation cell were produced by the same methods as those in Example 1 described above, and the charge/discharge characteristic was evaluated.

The initial discharge capacity of the negative electrode active material of Comparative Example 1 was found to be 149 mAh/g.

Comparative Example 2

In the step of preparing materials, $Li_2O$ and $TiO_2$ were weighed out in a molar ratio $Li_2O/TiO_2$ of 1.0/1.0.

The negative electrode active material of Comparative Example 2 was produced by the same method as that in Example 1 described above except for the molar ratio $Li_2O/TiO_2$.

The obtained negative electrode active material of Comparative Example 2 was subjected to powder X-ray diffraction analysis.

The results of the analysis are shown in FIG. 2.

The space group of the obtained negative electrode active material of Comparative Example 2 was found to be Fm3m.

The composition of the obtained negative electrode active material of Comparative Example 2 was found to be $Li_2Ti_1O_3$.

A test electrode and an evaluation cell were produced by the same methods as those in Example 1 described above, and the charge/discharge characteristic was evaluated.

The initial discharge capacity of the negative electrode active material of Comparative Example 2 was found to be 157 mAh/g.

The results thus obtained are shown in Table 1 below.

TABLE 1

| | Composition | x/y | Space Group | Discharge Capacity (mAh/g) |
|---|---|---|---|---|
| Example 1 | $Li_8Ti_5O_{14}$ | 1.6 | Fm3m | 197 |
| Example 2 | $Li_6Ti_5O_{13}$ | 1.2 | Fm3m | 233 |
| Example 3 | $Li_4Ti_5O_{12}$ | 0.8 | Fm3m | 246 |
| Example 4 | $Li_6Ti_{10}O_{23}$ | 0.6 | Fm3m | 285 |
| Example 5 | $Li_2Ti_5O_{11}$ | 0.4 | Fm3m | 302 |
| Example 6 | $Li_4Ti_5O_{12}$ | 0.8 | Fm3m | 271 |
| Comparative Example 1 | $Li_4Ti_5O_{12}$ | 0.8 | Fd3m | 149 |
| Comparative Example 2 | $Li_2Ti_1O_3$ | 2 | Fm3m | 157 |

Discussion

The negative electrode active materials of Examples 1 to 6 have an initial discharge capacity of 197 to 302 mAh/g.

More specifically, the initial discharge capacity of the negative electrode active materials of Examples 1 to 6 is larger than that of $Li_4Ti_5O_{12}$ having a spinel (Fd3m space group) structure, which is the negative electrode active material of Comparative Example 1.

A reason for this may be that the initial discharge capacity is increased by using the lithium titanium oxide with an Fm3m space group as a negative electrode active material in Examples 1 to 6.

The initial discharge capacity of the negative electrode active materials of Examples 1 to 6 is larger than that of $Li_2TiO_3$ with an Fm3m space group, which is the negative electrode active material of Comparative Example 2.

A reason for this may be that a large Li/Ti ratio in Comparative Example 2 results in a small amount of Li ions that can be intercalated into the structure and thus leads to a small initial discharge capacity.

The results described above indicate that satisfying $0.4 \leq x/y < 2$ can increase the initial discharge capacity.

The negative electrode active material of the present disclosure can be suitably used as a negative electrode active material for batteries such as secondary batteries.

What is claimed is:

1. An electrochemical device comprising:
   a negative electrode containing a negative electrode active material;
   a positive electrode; and
   an electrolyte,
   wherein the negative electrode active material contains a compound represented by composition formula (1) below, $$Li_xTi_yO_z \qquad \text{Formula (1)}$$

where $0.4 \leq x/y < 0.6$ and
   $x/2 + 3y/2 \leq z \leq x/2 + 2y$, and
   the compound having a crystal structure with an Fm3m space group.

2. The electrochemical device according to claim 1, wherein, in composition formula (1), $z = x/2 + 2y$.

3. The electrochemical device according to claim 1, wherein the negative electrode contains the negative electrode active material as a main component.

* * * * *